US007116104B2

(12) United States Patent
Reddy et al.

(10) Patent No.: US 7,116,104 B2
(45) Date of Patent: Oct. 3, 2006

(54) REDUCED SPECIFIC ABSORPTION RATIO $T_{1\rho}$-WEIGHTED MRI

(75) Inventors: Ravinder Reddy, Phoenixville, PA (US); Ari Borthakur, Philadelphia, PA (US); Andrew J. Wheaton, Swarthmore, PA (US); Sridhar R. Charagundla, Morton, PA (US)

(73) Assignee: The Trustees of the University of Pennsylvania, Philadelphia, PA (US)

( * ) Notice: Subject to any disclaimer, the term of this patent is extended or adjusted under 35 U.S.C. 154(b) by 127 days.

(21) Appl. No.: 10/991,888

(22) Filed: Nov. 18, 2004

(65) Prior Publication Data

US 2005/0151537 A1 Jul. 14, 2005

Related U.S. Application Data

(60) Provisional application No. 60/523,050, filed on Nov. 18, 2003.

(51) Int. Cl.
*G01V 3/00* (2006.01)
(52) U.S. Cl. ...................................... 324/307
(58) Field of Classification Search .................. None
See application file for complete search history.

(56) References Cited

U.S. PATENT DOCUMENTS

| 5,404,882 | A | * | 4/1995 | Santyr | ................. | 600/410 |
| 6,836,114 | B1 | * | 12/2004 | Reddy et al. | ................. | 324/307 |
| 2003/0218459 | A1 | * | 11/2003 | Reddy et al. | ................. | 324/314 |
| 2005/0122102 | A1 | * | 6/2005 | Reddy et al. | ................. | 324/307 |

OTHER PUBLICATIONS

Akella, S.V., et al., "Proteoglycan induced changes in $T_{1\rho}$ relaxation of articular cartilage at 4T," *Magn. Reson. Med.* 46:419-423 (2001).
Aronen, H.J., et al., "3D spin-lock imaging of human gliomas," *Magn. Reson. Imaging* 17:1001-1010 (1999).
Borthakur, et al., "In Vivo $T_{1\rho}$-weighted MRI of Amyloid Transgenic Mouse Model of Alzheimer's Disease,"*Proc. Intl. Soc. Mag. Reson. Med.* 11:2039 (2003).
Borthakur, et al., "Three-Dimensional $T_{1\rho}$-Weighted MRI at 1.5 Tesla," *J. Mag. Res. Imaging* 17:730-736 (2003).
Charagundla, S.R., et al., "Artifacts in $T_{1\rho}$-weighted Imaging: Correction with A Self-Compensating Spin-Locking Pulse," *J. Magn. Reson.* 162:113-121 (2003).
Collins, C.M., et al., "SAR and $B_1$ field distributions in a heterogeneous human head model within a birdcage coil," *Magn. Reson. Med.* 40:847-856 (1998).
Dixon, W.T., et al., "Myocardial suppression in vivo by spin locking with composite pulses," *Magn. Reson. Med.* 36:90-94 (1996).
Lamminen, et al., "$T_{1\rho}$ Dispersion Imaging of Diseased Muscle Tissue," *B. J. Rad.* 66:783-787 (1993).
Lin, et al., "Reduction of RF Power For Magnetization Transfer with Optimized Application of RF Pulses in K-Space," *Mag. Res. Med.* 50:114-121 (2003).

(Continued)

*Primary Examiner*—Diego Gutierrez
*Assistant Examiner*—Dixomara Vargas
(74) *Attorney, Agent, or Firm*—Drinker Biddle & Reath LLP; Evelyn H. McConathy, Esq.

(57) ABSTRACT

Provided is a $T_{1\rho}$-weighted pulse sequence with reduced specific absorption rate for magnetic resonance imaging (MRI). Also provided is a method of reducing the specific absorption rate in $T_{1\rho}$-weighted MRI.

7 Claims, 11 Drawing Sheets

OTHER PUBLICATIONS

Markkola, A.T., et al., "$T_{1\rho}$ dispersion imaging of head and neck tumors: a comparison to spin lock and magnetization transfer techniques," *J. Magn. Reson. Imaging* 7:873-879 (1997).

Markkola, A.T., et al., "Determination of $T_{1\rho}$ values for head and neck tissues at 0.1T: a comparison to $T^1$ and $T^2$ relaxation times," *Magn. Reson. Imaging* 16:377-383 (1998).

Parker, et al., "The Application of Magnetization Transfer to MR Angiography with Reduced Total Power," *MRM* 34:283-286 (1995).

Peterfy, et al., "Recent Advances in Magnetic Resonance Imaging of the Musculoskeletal System," *R. Cl. N. Amer.* 32:2:291-311 (1994).

Peterfy, et al., "Emerging Applications of Magnetic Resonance Imaging in the Evaluation of Articular Cartilage," *R. Cl. N. Amer.*, 34:2:195-213 (1996).

Peterfy, et al., "Scratching the Surface Articular Cartilage Disorders In the Knee," *Mag. Res. Imaging* 8:409-430 (2000).

Ramadan, U.A., et al., "On- and off-resonance spin-lock MR imaging of normal human brain at 0.1 T: possibilities to modify image contrast," *J. Magn. Reson. Imaging* 16:1191-1199 (1998).

Recht, et al., "MR Imaging of Articular Cartilage: Current Status and Future Directions," *AJR* 163: 283-290 (1994).

Redfield, A.G. "Nuclear Magnetic Resonance Saturation and Rotary Saturation in Solids," *Phys. Rev.* 98:1787 (1955).

Regatte, R.R., et al., "Proteoglycan Depletion-induced Changes in Transverse Relaxation Maps of Cartilage: Comparison of T2 and T1r," *Acad. Radiol.* 9:1388-1394 (2002).

Regatte, R.R., et al., "Proton Spin-Lock Ratio Imaging for Quantitation of Glycosaminoglycans in Articular Cartilage," *J. Mag. Res. Imaging* 17:114-121 (2003).

Santyr, G.E., "MR Imaging of the Breast—Imaging and Tissue Characterization Without Intravenous Contrast," *MRI Cl. N. Amer.* 2:4:673-690 (1994).

Smith, D.K., "MR Imaging of Normal and Injured Wrist Ligaments," *MRI Cl. N. Amer.* 3:2:229-248 (1995).

Softka, et al., "Magnetic Resonance Imaging of the Wrist," *Radiology* 5:3:217-226 (2001).

Tailor, D., et al., "High Resolution Assessment of Blood Flow in Murine RIF-1 Tumors by Monitoring Uptake of $H_2^{17}O$ with Proton $T_{1\rho}$-Weighted Imaging," *Mag. Res. Med.*, 49:1-6 (2003).

Tailor, D., et al., "Indirect $^{17}O$-Magnetic Resonance Imaging of Cerebral Blood Flow in the Rat", *Magnetic Res. Med.* 49:479-487 (2003).

Thomas, et al., "Application of Magnetization Transfer at 3.0 T in Three-Dimensional Time-of-Flight Magnetic Resonance Angiography of the Intracranial Arteries," *J. Mag. Res. Imaging* 15:479-483 (2002).

Virta, A., et al., "$T_{1\rho}$ MR imaging characteristics of human anterior tibial and gastrocnemius muscles," *Acad. Radiol.* 5:104-110 (1998).

* cited by examiner

REDUCED SPECIFIC ABSORPTION RATIO $T_{1\rho}$-WEIGHTED MRI

REFERENCE TO RELATED APPLICATIONS

This application claims priority to Ser. No. 60/523,050, filed Nov. 18, 2003, herein incorporated in its entirety.

FIELD OF THE INVENTION

This invention relates generally to the field of magnetic resonance imaging (MRI), specifically to $T_{1\rho}$-weighted MRI pulse sequences and reduced specific absorption rate spin-locking.

BACKGROUND OF THE INVENTION

Magnetic resonance imaging (MRI) has become the modality of choice for imaging joints due to its excellent definition of ligaments, cartilage, bone, muscle, fat and superior soft tissue contrast (Smith, *Magn. Reson. Imaging Clin. N. Am.* 3:229–248 (1995), Sofka et al., *Radiology* 5:217–226 (2001)). For two decades, proton magnetic resonance imaging (MRI) has shown its efficacy in the noninvasive analysis of soft tissues, particularly in the diagnosis of tendinomuscular and osteoarticular diseases (Peterfy et al., *Radiol. Clin. North Am.* 34:195 (1996); Peterfy, *Magn. Reson, Imaging Clin. N. Amer.* 8:409–430 (2000)). Recent developments in chondroprotective therapies, cartilage grafting, gene therapy and tissue engineering have increased the demand for accurate and non-invasive techniques that will enable the detection of the early biochemical changes in vivo. Conventional proton MR techniques have been able to provide information about late stages of degeneration in which structural defects are present (Recht et al., *Am. J. Roent.* 163:283–290 (1994); Peterfy et al., *Radiol. Clin. North Am.* 32:291–311 (1994)).

$T_{1\rho}$ provides an alternative contrast compared to conventional MRI methods. Since the first description by Redfield (*Phys. Rev.* 98:1787 (1955)), spin-locking technique has been used extensively, to investigate the low frequency interactions between the macromolecules and bulk water. Several authors have investigated the $T_{1\rho}$ dispersion characteristics of biological tissues, including: muscle tissue (Lamminen et al., *Br. J. Radiol.* 66:783–787 (1993), Virta et al., *Acad. Radiol.* 5:104–110 (1998)); brain (Ramadan et al., *Magn. Reson. Imaging* 16:1191–1199 (1998)); gliomas (Aronen et al., *Magn. Reson. Imaging* 17:1001–1010 (1999)); breast and cancer tissues (Dixon et al., *Magn. Reson. Med.* 36:90–94 (1996), Santyr et al., *Magn. Reson. Imaging Clin. N. Am.* 2:673–690 (1994)); and tumors (Markkola et al., *Magn. Reson. Imaging* 16:377–383 (1998), Markkola et al., *J. Magn. Reson. Imaging* 7:873–879 (1997)). These studies have demonstrated the potential value of $T_{1\rho}$-weighting in evaluating various physiologic/pathologic states. The studies have shown $T_{1\rho}$ to be sensitive to physico-chemical processes, (e.g., spin-spin interaction, chemical exchange, etc.) that occur at small interaction frequencies.

Recent work has also demonstrated the feasibility of measuring regional blood flow and oxygen metabolism in a rat brain via $T_{1\rho}$ imaging (Tailor et al., *Magn. Reson. Med.* 49:1–6 (2003); Tailor et al., *Magn. Reson. Med.* 49:479–487 (2003)). $T_{1\rho}$-weighted MRI has shown some promise in generating tissue contrast based on variations in protein content. For example, it has been shown that $T_{1\rho}$ MRI can map the distribution of glycosaminoglycans in cartilage (Akella et al., *Magn. Reson. Med.* 46:419–423 (2001); Regatte et al., *Acad. Radiol.* 9:1388–1394 (2002); Regatte et al., *J. Magn. Reson. Imaging* 17:114–121 (2003)) and to visualize amyloid plaques in mice affected with Alzheimer's disease (Borthakur et al., *Proc. Internat'l. Soc. Magnetic Reson. Med.*, Toronto (2003); Borthakur et al., *J. Magn. Reson. Imaging* (2003)).

Several authors have investigated reduced SAR MR pulse sequences that are used to obtain magnetization transfer, or "MT," weighted images (Parker et al., *Magn. Reson. Med.* 34:283–286 (1995); Thomas et al., *J. Magn. Reson. Imaging* 15:479–483 (2002); Lin et al., *Magn. Reson. Med.* 50:114–121 (2003)). In these pulse sequences, the saturation pulses necessary for the MT effect were applied only while acquiring the middle phase-encode lines of k-space. Since the center of k-space determines the signal of the MR image, this ordering scheme results in MT-weighted MR images with reduced SAR of the pulse sequence. Consequently, a need remained for a low SAR versions of the respective $T_{1\rho}$ pulse sequence for additional applications, including MRI pulse sequence containing long RF pulses, such as magnetization transfer MRI or sequences containing decoupling pulses.

A 3D, gradient-echo readout of a $T_{1\rho}$-weighted MR signal has been used (Aronen et al., 1999). That sequence was implemented on a low field magnet (0.1 T) with a combination of adiabatic pulses, and RF spoiling alone was employed to destroy unwanted transverse coherence. The use of adiabatic pulses has certain drawbacks, e.g., their long pulse lengths result in substantial decay of magnetization during the pulse period. These pulses cannot be easily calibrated on a clinical scanner, are more RF power intensive and may introduce specific absorption rate (SAR) issues. Moreover, any residual transverse magnetization resulting from incomplete restoration of the $T_{1\rho}$-prepared magnetization to the longitudinal axis by the second adiabatic pulse will result in unwanted image artifacts.

Furthermore, the US FDA has established guidelines to regulate the radio frequency energy in an MRI (US Food & Drug Admin. November 1998). Consequently, MRI has been limited to certain applications so that the energy deposition by the radio frequency pulses in a pulse sequence, measured as the specific absorption rate (SAR), does not exceed safety guidelines for imaging human subjects. For example, the spin-lock pulse cluster in a $T_{1\rho}$-weighted sequence significantly increases SAR. In order to maintain SAR within FDA guidelines, the pulse repetition time (TR) must be significantly lengthened. The longer imaging time increases discomfort of a subject, increases the chances of involuntary motion by the subject, thereby accentuating possible motion artifacts, and reduces the ability to manipulate $T_1$-weighted image contrast. Consequently, a need has remained until the present invention for a reduced SAR version of the spin-locked sequence.

SUMMARY OF THE INVENTION

The present invention provides a reduced specific absorption rate (SAR) $T_{1\rho}$-weighted sequence and a method for producing full-contrast $T_{1\rho}$-weighted images while minimizing SAR magnetic resonance (MR) imaging.

In one aspect of the present invention, a $T_{1\rho}$-weighted pulse sequence with reduced specific absorption rate (SAR) for MR imaging is provided. A preferred embodiment of the $T_{1\rho}$-weighted pulse sequence comprises: a pre-encoded spin-lock pulse cluster, further comprising two nonselective pulses separated by a spin-lock pulse having an amplitude;

phase-encoded lines in a k-space, wherein the k-space has at least two portions, generally a central portion and a remaining portion, and wherein the central portion is a fraction of the k-space; a high power amplitude spin-lock pulse applied for the phase-encoded lines in the central portion of k-space; and a low amplitude spin-lock applied for the remaining portion of the k-space. In another aspect of the present invention, the fraction of the k-space having a high power spin-lock pulse ranges from 6.25% to 100%.

Another aspect of the present invention is a method of obtaining reduced SAR $T_{1\rho}$-weighted MR images comprising applying a full amplitude spin-lock pulse for a fraction of a k-space, wherein the k-space comprises at least two portions, generally divided into a central portion and a remaining portion, and wherein the fraction is the central portion of the k-space; and applying low amplitude spin-lock pulse for the remaining portion of the k-space.

Additional objects, advantages and novel features of the invention will be set forth in part in the description, examples and figures which follow, and in part will become apparent to those skilled in the art on examination of the following, or may be learned by practice of the invention.

DESCRIPTION OF THE DRAWINGS

The foregoing summary, as well as the following detailed description of the invention, will be better understood when read in conjunction with the appended drawings. For the purpose of illustrating the invention, there are shown in the drawings, certain embodiment(s) which are presently preferred. It should be understood, however, that the invention is not limited to the precise arrangements and instrumentalities shown.

DESCRIPTION OF CERTAIN PREFERRED EMBODIMENTS OF THE INVENTION

The present invention provides a reduced specific absorption rate (SAR) $T_{1\rho}$-weighted magnetic resonance imaging (MRI) sequence and methods for use thereof. The reduced SAR sequence provides $T_{1\rho}$-weighted MRI with a reduction in total deposition of radio frequency (RF) energy.

Figure 1:
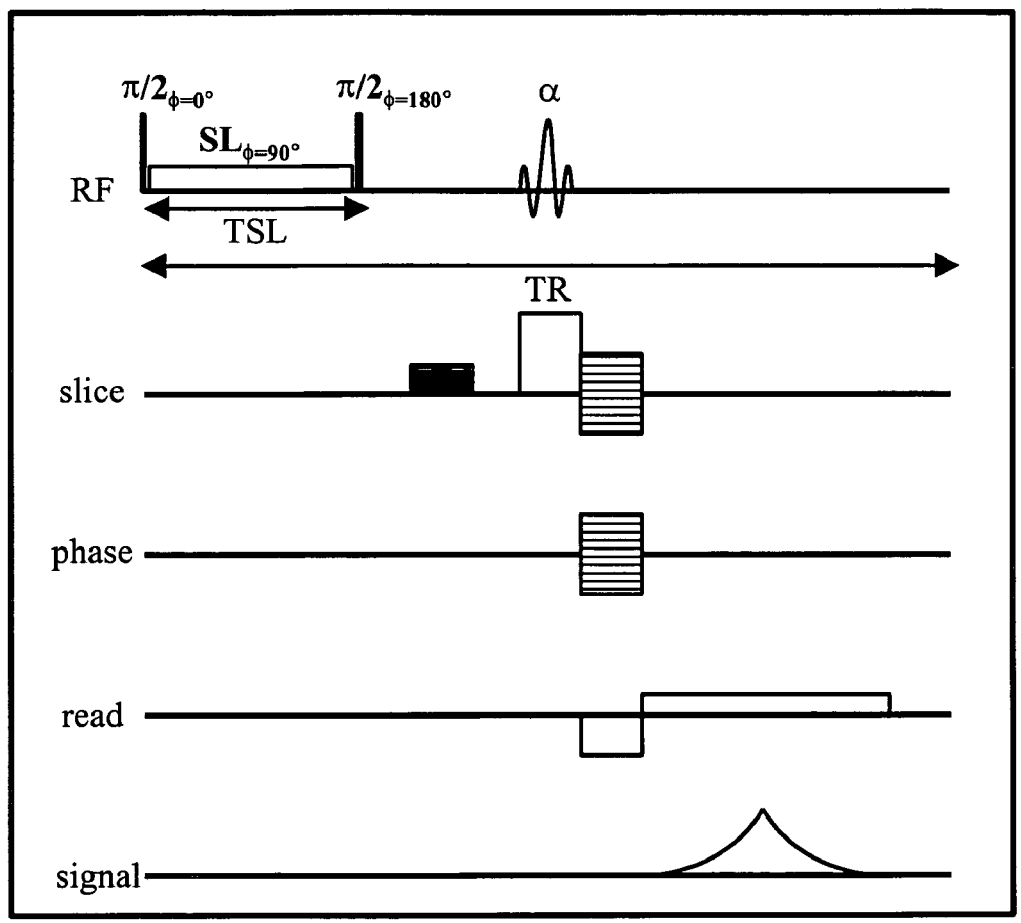
FIG. 1 depicts a preferred embodiment of a $T_{1\rho}$-weighted MRI pulse sequence.

FIG. 1 shows a preferred embodiment of a 3D $T_{1\rho}$-weighted MRI pulse sequence. The first three RF pulses and the crusher gradient, shown in solid black, make up the pre-encoded section. The spin-lock (SL) pulse is a single pulse with a constant phase and duration TSL. Alternatively, the SL pulse is divided into even number segments with alternating phase and equal durations ("self-compensating"). The crusher gradient is applied to destroy any residual magnetization in the traverse plane. The $T_{1\rho}$-prepared longitudinal magnetization can then be recalled and spatially encoded by any imaging sequence. For example, in FIG. 1, a 3D fast gradient-echo sequence readout is shown.

Figure 2:
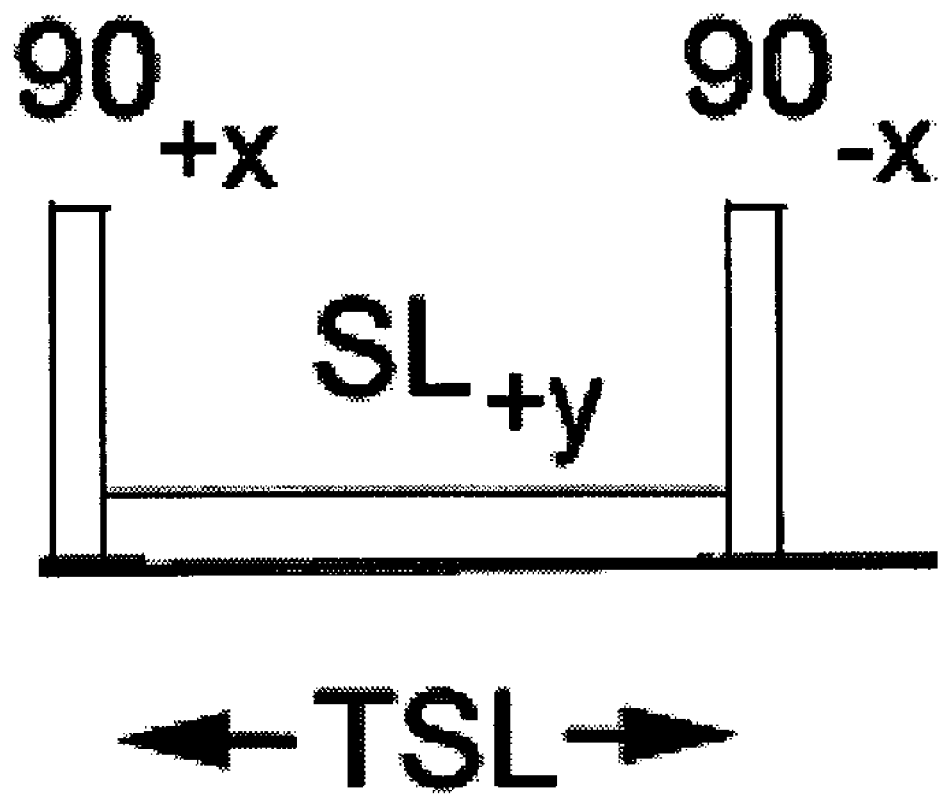
FIG. 2 shows a preferred embodiment of a pre-encoded spin-lock pulse cluster comprising a pair of nonselective 90 degree pulses separated by a low power "spin-lock" pulse of duration TSL.

FIG. 2 shows a pre-encoded spin-lock pulse cluster comprising a pair of nonselective 90-degree pulses separated by a low power "spin-lock" pulse of duration TSL. As the spin-lock amplitude ($B_1$) decreases, the $T_{1\rho}$ relaxation phenomenon becomes less efficient and the value of $T_{1\rho}$ decreases.

The principle of partial k-space acquisition is used in the embodiments of the present invention to perform $T_{1\rho}$-weighted MRI with reduced SAR. For example, in one embodiment of the partial k-space acquisition, the k-space may comprise two portions, a central or middle portion and a remaining portion. The middle phase-encoded lines of k-space are acquired with the SL pulse and the two nonselective pulses turned on. The remaining k-space lines are acquired with the $T_{1\rho}$ pulse turned off (or set to very low values, e.g., an amplitude of ~100 Hz). The acquisition order of k-space lines places the "$T_{1\rho}$-on" lines in the middle or central phase-encode lines of k-space. This assures that the main contribution to signal intensity and image contrast remains $T_{1\rho}$-weighted.

In the preferred embodiments, the subjects are imaged using a fractional k-space $T_{1\rho}$ MRI pulse sequence. The fraction of k-space that contains $T_{1\rho}$-weighted MR signals ("f") is calculated from Equation 1:

$$f = k_y SL / k_y \max \text{ (in \%)} \qquad \text{(Equation 1)}$$

wherein $k_y$max is the maximum number of k-space lines acquired in the phase encoded direction and $k_y$SL is the number of lines that will be acquired with $T_{1\rho}$ pulses turned on.

Figure 3:
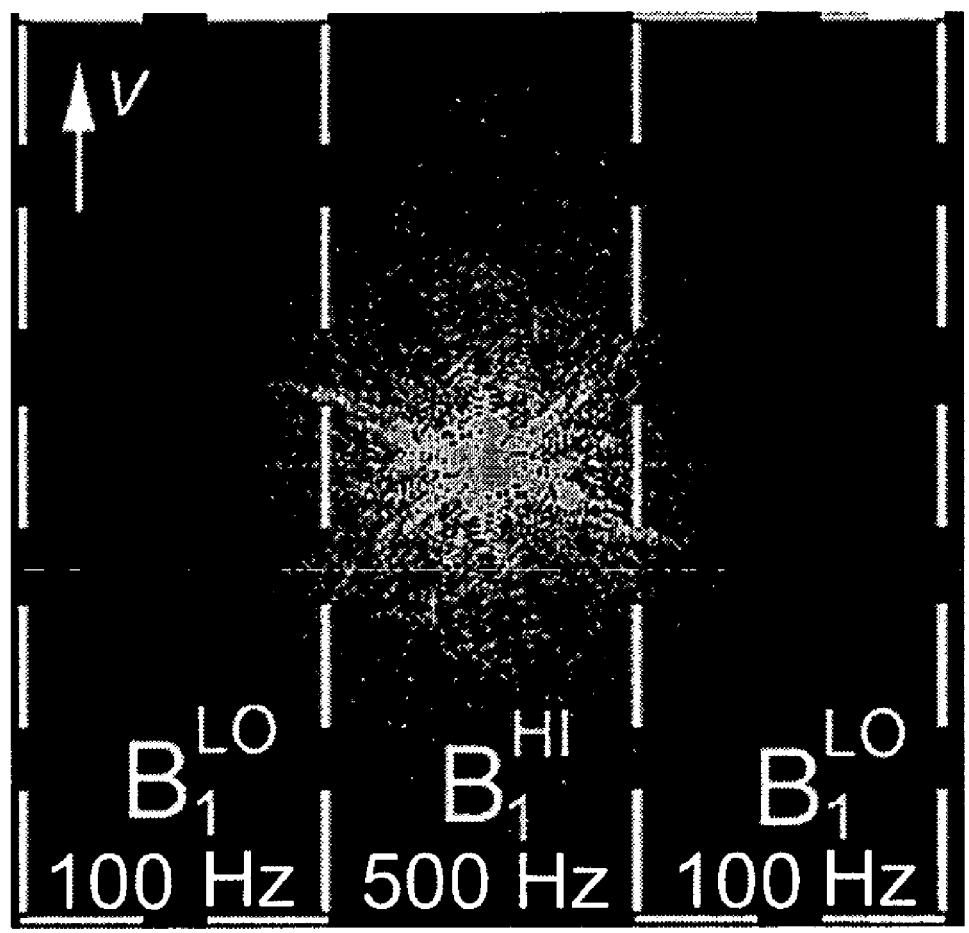
FIG. 3 shows a preferred embodiment wherein a full amplitude spin-lock is applied in the central portion of k-space and a low amplitude spin-lock is applied in the remainder of high frequency k-space.

For example, as shown in FIG. 3, a full amplitude spin-lock pulse is applied for only the phase-encode lines in the central portion of k-space where most of the signal energy exists. FIG. 3 shows the full amplitude, $\gamma B_1$, is 500 Hz. However, other full amplitudes may be used. For the remainder of high frequency k-space, a low amplitude spin-lock pulse is applied. FIG. 3 shows the low amplitude pulse is 100 Hz. However, alternative amplitudes may be used. In this way, the majority of the signal energy maintains full $T_{1\rho}$ contrast while SAR is significantly reduced. K-space may be divided into a variety of different spin-lock pulse amplitudes; in this example we have demonstrated dividing it into two (central and remainder portions). However, the technique may be generalized so that every k-space line may have different spin-lock pulse amplitude.

EXAMPLES

The present invention is further described in the following examples in which experiments were conducted to validate the pulse sequences and show particular applications for the pulse sequences. These examples are provided for purposes of illustration to those skilled in the art, and are not intended to be limiting unless otherwise specified. Moreover, these examples are not to be construed as limiting the scope of the appended claims. Thus, the invention should in no way be construed as being limited to the following examples, but rather, should be construed to encompass any and all variations which become evident as a result of the teaching provided herein.

Example 1

To confirm the applicability of the modified sequence, an agarose gel phantom was imaged using both conventional and fractional k-space $T_{1\rho}$ MRI pulse sequences. The value of f was varied and the resulting error in the calculation of $T_{1\rho}$ was measured.

The reported $T_{1\rho}$ values are an average of all pixels in a $T_{1\rho}$ map of the phantom. These $T_{1\rho}$ maps were calculated by fitting the signal intensity of each pixel from the $T_{1\rho}$-weighted images of the phantom acquired at different SL pulse durations (TSL) to the appropriate signal function (Borthakur, et al., *J. Magn. Reson. Imaging* 17:730–736 (2003)).

A modified spin-lock pulse sequence was created based on the spin-echo pulse sequence on the Varian Inova (Varian Corp., Palo Alto, Calif.) console attached to a 4.7 Tesla horizontal small-bore MRI scanner. A test-tube containing 4% (w/v) of agarose gel was imaged with varying percentages of the central k-space being spin-locked with either a "high" ($B_1$=500 Hz) or a "low" ($B_1$=100 Hz) amplitudes for the spin-lock pulse. The low $B_1$ power was used to assure that the TSL time was the same for all lines of k-space. A series of $T_{1\rho}$-weighted images were collected for TSL=10, 20, 30, 40 ms using a self-compensated spin-lock pulse (Charagundla et al., *J. Magn. Reson.* 162:113–121 (2003)). The image parameters for all images were: acquisition matrix=128×128, FOV=2 cm×2 cm, TE/TR=15/500 ms, and averages=2. A series of five images were acquired with varying percentages of the center k-space being spin-locked (i.e. f was varied from 6.25%, 12.5%, 25%, 50%, to 100%).

Figure 4:
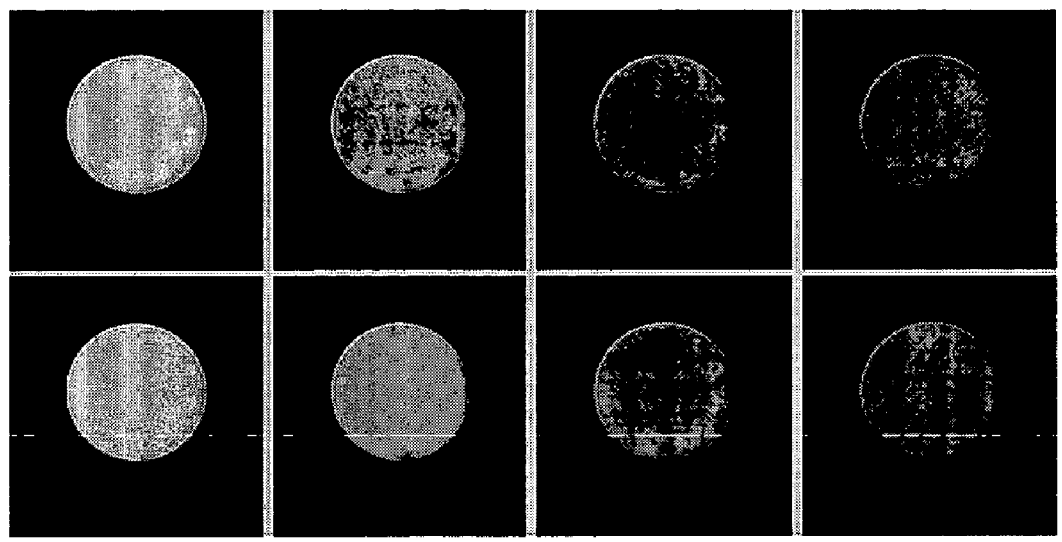
FIG. 4 shows sets of $T_{1\rho}$-weighted images collected with spin-lock pulse increasing spin-lock pulse durations (TSL) from left to right for fully high spin-locked k-space (top row) and $T_{1\rho}$-weighted images, wherein only the center 6.25% of the k-space is high spin locked (bottom row).

FIG. 4 shows a comparison of $T_{1\rho}$-weighted images with full amplitude spin-lock pulse and with a fraction of k-space with full amplitude spin-lock. In FIG. 4, the top row shows a series of $T_{1\rho}$-weighted images with fully high spin-locked (500 Hz) k-space. The bottom row shows a series of $T_{1\rho}$-weighted images with only the center 6.25% of k-space high spin-locked. In the images of the bottom row, the remainder of the k-space is spin-locked at 100 Hz. As shown in FIG. 4, the images are qualitatively similar in the signal-to-noise and image quality (blurring, etc.).

Figure 5:
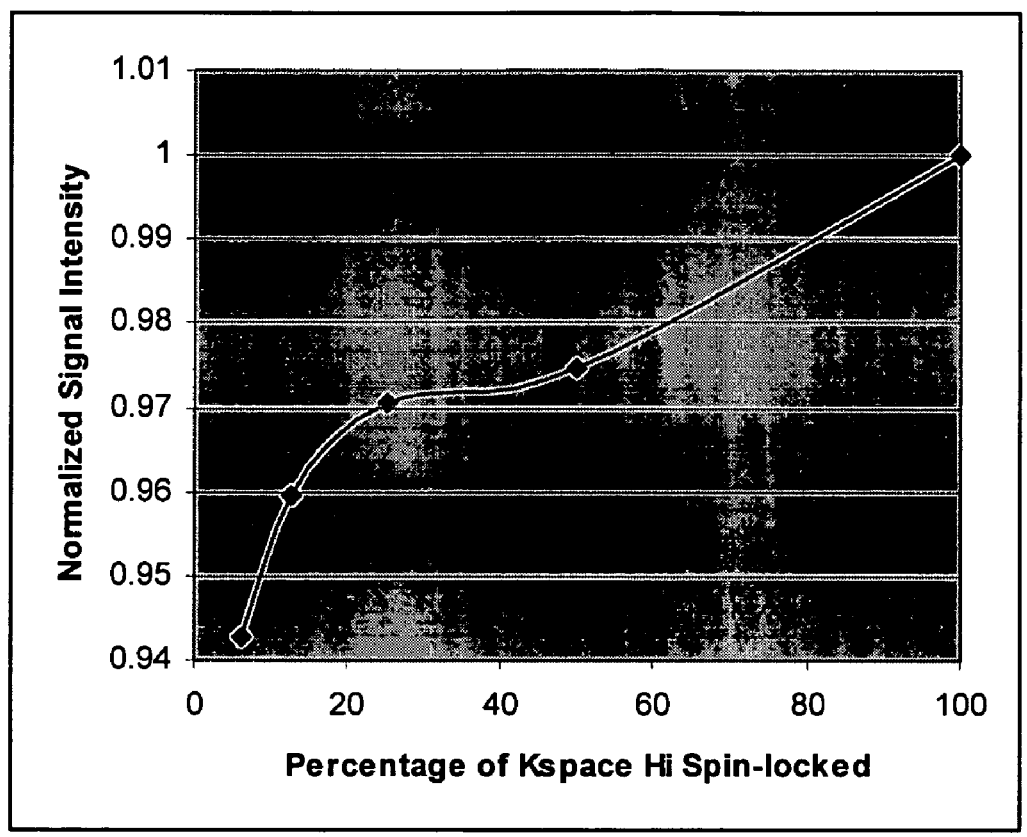
FIG. 5 shows a comparison of signal intensities as a function of the percentage of k-space high spin-locked.

FIG. 5 shows a comparison of signal intensities from the first image in each $T_{1\rho}$ series. TSL is 10 ms for all series. The signal intensity was normalized to that of the 100% high spin-lock image. ROIs were identical in all images.

Figure 6:
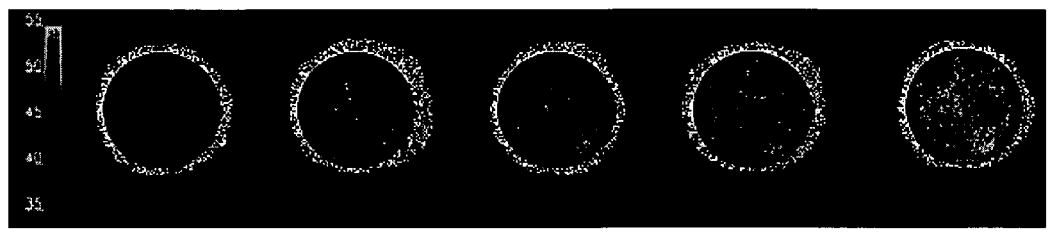
FIG. 6 shows $T_{1\rho}$ maps of an agarose bottle collected with increasing percentages of the central k-space that is full spin-locked from left to right.

FIG. 6 shows $T_{1\rho}$ maps of the phantom. As shown in FIG. 6, as the percentage of k-space that was spin-locked decreases, the average $T_{1\rho}$ increases.

Figure 7:
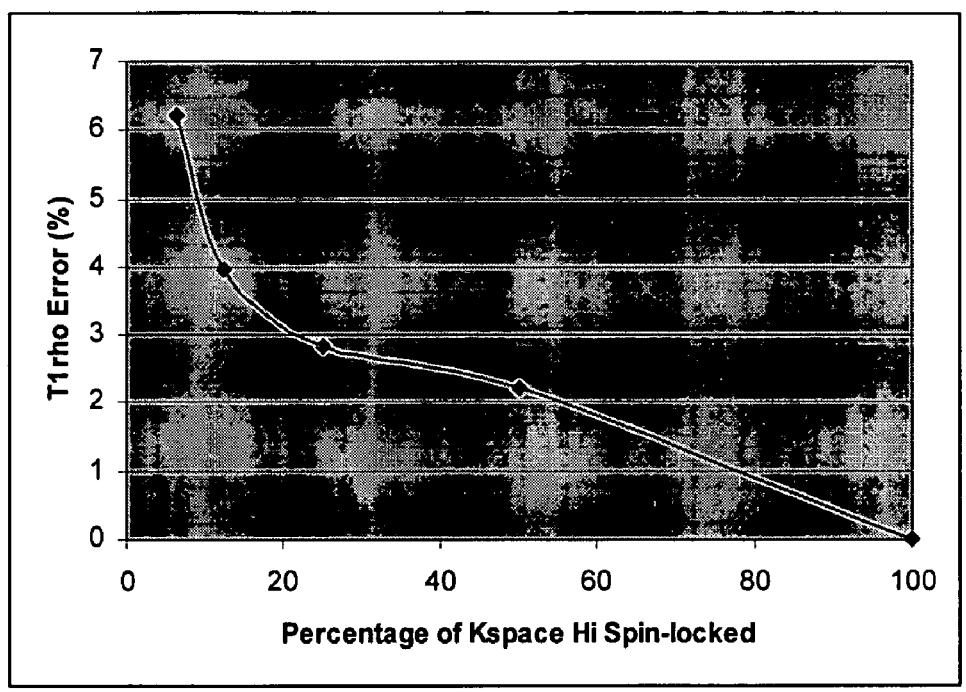
FIG. 7 shows the error in the measurement of $T_{1\rho}$ for each percentage of the central k-space that is full spin-locked.

FIG. 7 shows the difference in the measurement of the average $T_{1\rho}$ in each agarose bottle with respect to the fully spin-locked $T_{1\rho}$ map. The difference in $T_{1\rho}$ decreases as the percentage of k-space that was fully spin-locked increases.

As shown in FIG. 7, there was an error of only ~6% for 6.25% k-space being fully spin-locked.

Example 2

In a second example, the pulse sequence was implemented on a Varian Inova 4.7T MRI scanner. A single axial 2 mm-thick slice of healthy in vivo mouse brain was acquired. The imaging parameters were: FOV=2 cm×2 cm, acquisition matrix=128×128, and TE/TR=13/1000 ms. Six $T_{1\rho}$-weighted images were acquired at TSL=10, 20, 30, 40, 60 and 80 ms. The six-image series was repeated for various fractions of k-space receiving a full amplitude spin-lock pulse, f (i.e., the six-image series was repeated for f=100%, 50%, 25% and 1%).

$T_{1\rho}$ was measured from each image series by fitting the image data as a function of TSL using linear regression. The average $T_{1\rho}$ for each data set was measured as the mean of the $T_{1\rho}$ values within manually drawn regions-of-interest on the cortical and hippocampal regions. The relative change in $T_{1\rho}$ for each image set was calculated with respect to $T_{1\rho}$ data from the 100% full amplitude spin-lock data. The SAR, of a single pulse of flip angle α and duration τ (in ms), is calculated according to Equation 2 (Collins, et al., *Magn. Reson. Med.* 40:847–856 (1998)):

$$SAR(\alpha, \tau) = f\left(\frac{3}{\tau}\right)^2 \left(\frac{\alpha}{90°}\right) SAR(90°, 3) \qquad \text{(Equation 2)}$$

Figure 8:
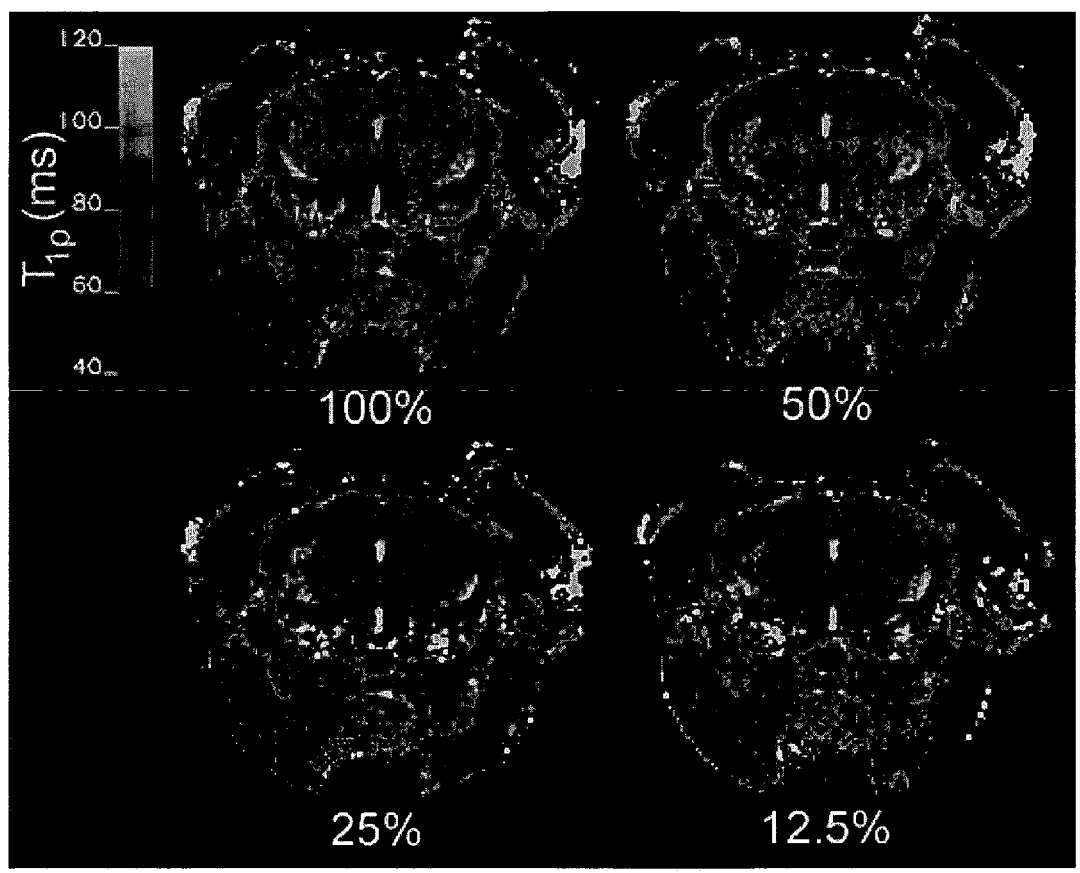
FIG. 8 shows $T_{1\rho}$ maps of an in vivo mouse brain, wherein 100%, 50%, 25% and 12.5% of central k-space is full spin-locked.
Figure 9:
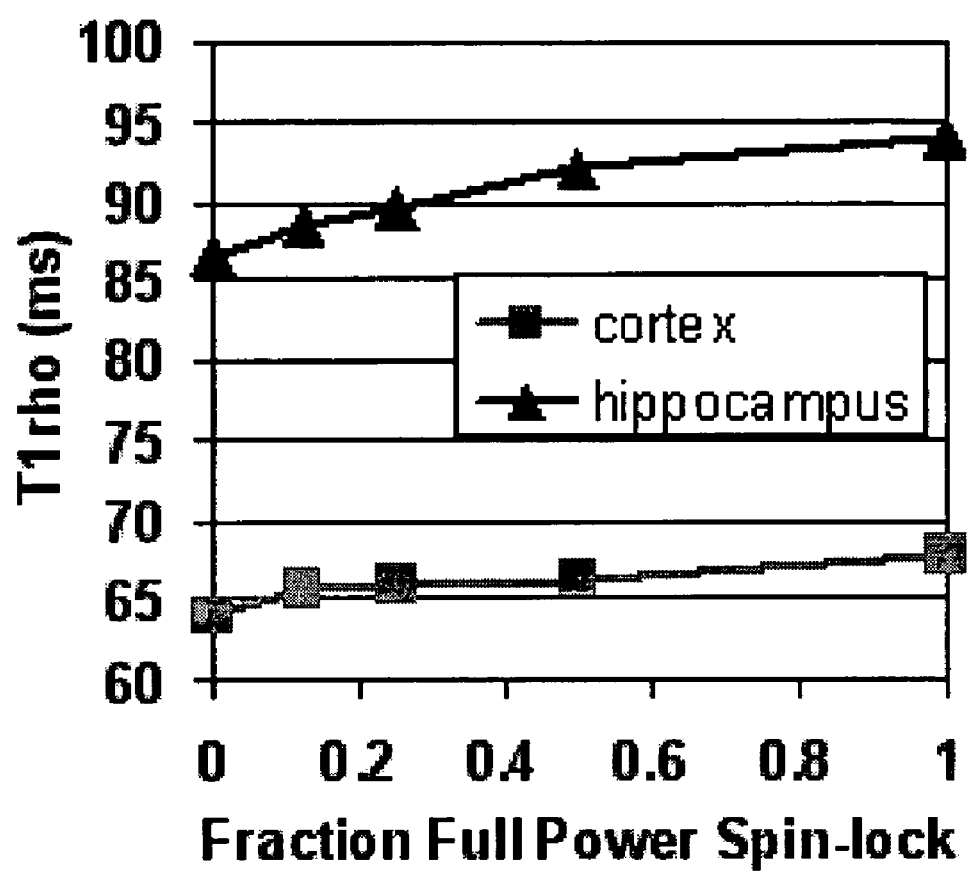
FIG. 9 shows the mean $T_{1\rho}$ in two regions of the mouse brain.
Figure 10:
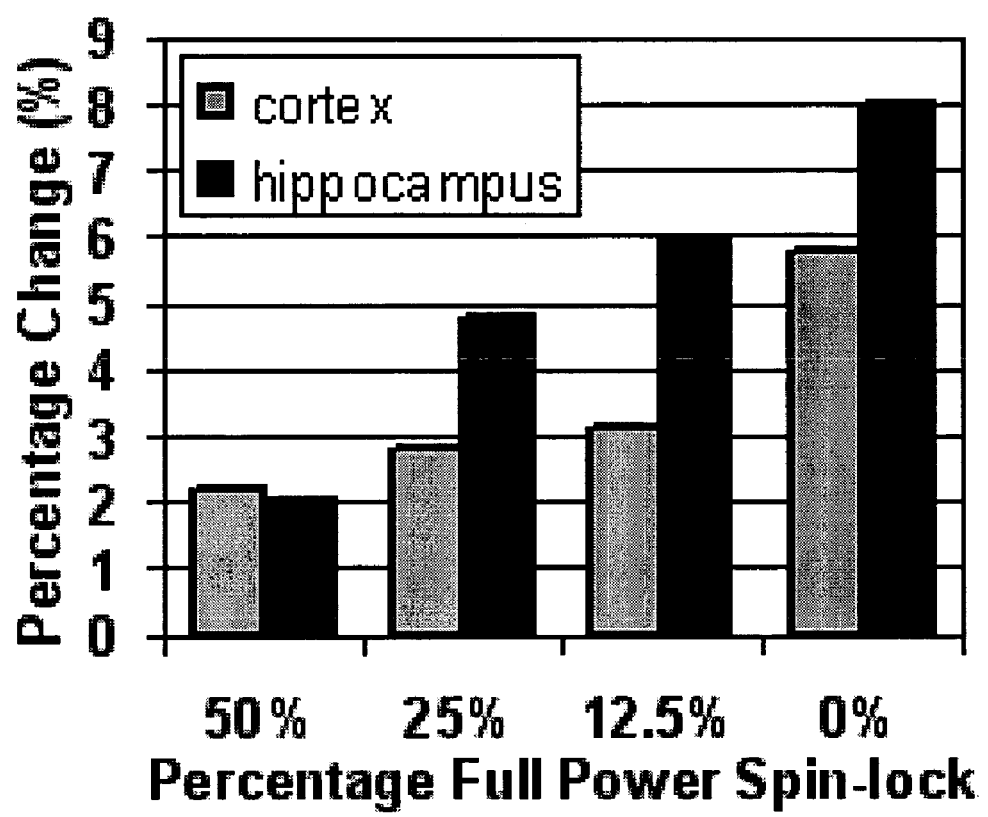
FIG. 10 shows the change in $T_{1\rho}$ with respect to full-spin lock data.

As shown in FIG. 8, the reduced SAR sequence produced $T_{1\rho}$ maps are very similar to the full spin-lock map (100%). As shown in FIG. 9, the mean $T_{1\rho}$ values in two regions of the brain produced minimal change in $T_{1\rho}$. Likewise, FIG. 10 shows the change in $T_{1\rho}$ with respect to full spin-lock data is small, not more than a few percent.

Figure 11:
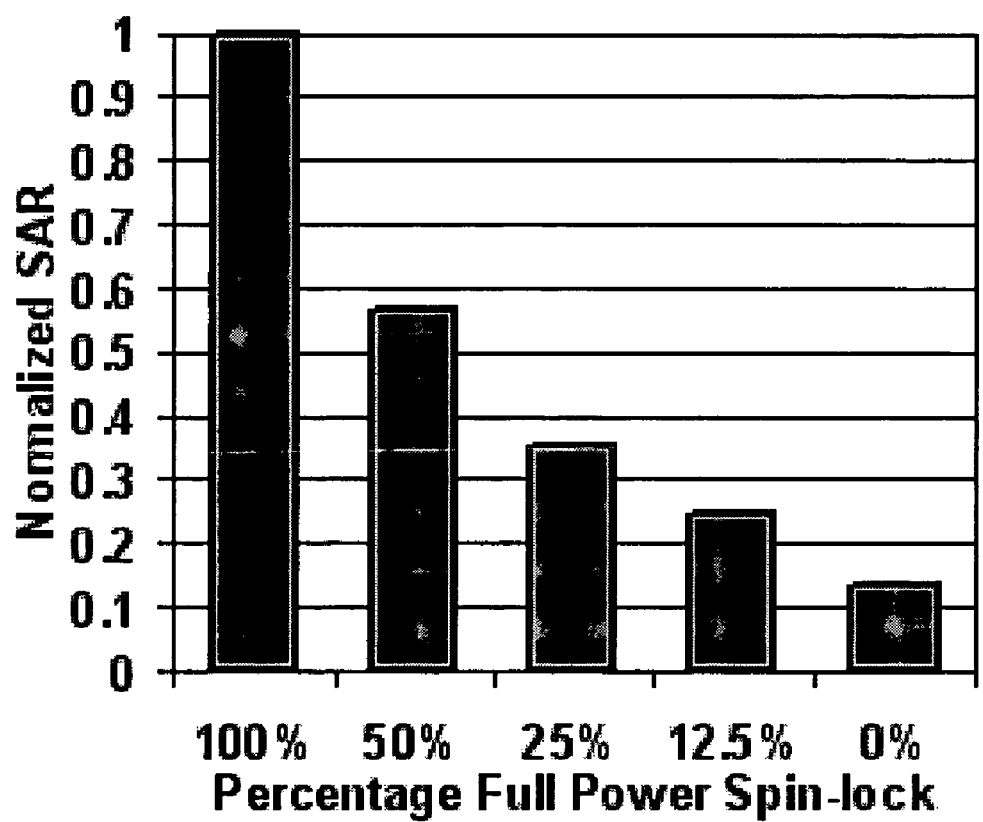
FIG. 11 shows the modeled SAR data normalized with respect to 100% power.

FIG. 11 shows the modeled SAR data normalized with respect to 100% power. As shown in FIG. 11, the SAR model of Equation 2 predicts a substantial reduction in SAR.

The reduced SAR $T_{1\rho}$-weighted sequence of the current invention produces full-contrast $T_{1\rho}$-weighted images while minimizing SAR. Likewise, with appropriate imaging parameters, the reduced SAR sequence can be used to safely acquire $T_{1\rho}$-weighted images on humans with short TR, even at high fields ($B_0$>3T). The sequence and method can reduce SAR in any pulse sequence that involves long duration radio frequency pulses such as spin-decoupling sequences.

The disclosures of each patent, patent application and publication cited or described in this document are hereby incorporated herein by reference, in their entirety.

While the foregoing specification has been described with regard to certain preferred embodiments, and many details have been set forth for the purpose of illustration, it will be apparent to those skilled in the art without departing from the spirit and scope of the invention, that the invention may be subject to various modifications and additional embodiments, and that certain of the details described herein can be varied considerably without departing from the basic principles of the invention. Such modifications and additional embodiments are also intended to fall within the scope of the appended claims.

What is claimed is:

1. A $T_{1\rho}$-weighted pulse sequence with reduced specific absorption rate for magnetic resonance imaging, comprising:
- a pre-encoded spin-lock pulse cluster, further comprising two nonselective pulses separated by a spin-lock pulse having an amplitude;
- phase-encoded lines in a k-space, wherein the k-space has at least two portions, generally separated into a central portion and a remaining portion, and wherein the central portion is a fraction of the k-space;
- a high power amplitude spin-lock pulse applied for the phase-encoded lines in the central portion of k-space; and
- lower amplitude, and therefore lower power, spin-lock pulse amplitudes applied for the remaining portion(s) of the k-space.

2. The $T_{1\rho}$-weighted pulse sequence of claim 1, wherein the fraction of the k-space comprises 100% of the spin-lock pulse.

3. The $T_{1\rho}$-weighted pulse sequence of claim 1, wherein the fraction of the k-space comprises 50% of the spin-lock pulse.

4. The $T_{1\rho}$-weighted pulse sequence of claim 1, wherein the fraction of the k-space comprises 25% of the spin-lock pulse.

5. The $T_{1\rho}$-weighted pulse sequence of claim 1, wherein the fraction of the k-space comprises 12.5% of the spin-lock pulse.

6. The $T_{1\rho}$-weighted pulse sequence of claim 1, wherein the fraction of the k-space comprises 6.25% of the spin-lock pulse.

7. A method of reducing specific absorption rate in $T_{1\rho}$-weighted imaging, comprising:
- applying a full amplitude spin-lock pulse for a fraction of a k-space, wherein the k-space comprises at least two portions, a central portion and a remaining portion, and wherein the fraction is the central portion of the k-space; and
- applying lower amplitude, and therefore lower power, spin-lock pulse for the remaining portion of the k-space.

* * * * *